US009210347B2

(12) United States Patent
Yin et al.

(10) Patent No.: US 9,210,347 B2
(45) Date of Patent: Dec. 8, 2015

(54) VERTICAL 4-WAY SHARED PIXEL IN A SINGLE COLUMN WITH INTERNAL RESET AND NO ROW SELECT

(71) Applicant: MICRON TECHNOLOGY, INC., Boise, ID (US)

(72) Inventors: Zhiping Yin, Boise, ID (US); Xiaofeng Fan, San Jose, CA (US); Xiangli Li, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 13/733,676

(22) Filed: Jan. 3, 2013

(65) Prior Publication Data

US 2013/0128089 A1    May 23, 2013

Related U.S. Application Data

(62) Division of application No. 12/285,308, filed on Oct. 1, 2008, now Pat. No. 8,350,939.

(51) Int. Cl.
| | |
|---|---|
| H04N 5/335 | (2011.01) |
| H04N 5/3745 | (2011.01) |
| H01L 27/146 | (2006.01) |
| H04N 5/357 | (2011.01) |

(52) U.S. Cl.
CPC ........ *H04N 5/3745* (2013.01); *H01L 27/14609* (2013.01); *H01L 27/14641* (2013.01); *H04N 5/3575* (2013.01)

(58) Field of Classification Search
USPC .............. 348/273, 308, 203.1, 268, 269, 272, 348/294
See application file for complete search history.

(56) References Cited

U.S. PATENT DOCUMENTS

| | | | | |
|---|---|---|---|---|
| 4,928,261 A | * | 5/1990 | Nguyen | 365/104 |
| 5,365,199 A | | 11/1994 | Brooks | |
| 6,731,335 B1 | * | 5/2004 | Kim et al. | 348/308 |
| 7,199,931 B2 | | 4/2007 | Boettiger et al. | |
| 7,812,874 B2 | | 10/2010 | Iwabuchi et al. | |
| 2002/0024068 A1 | | 2/2002 | Shinohara | |
| 2002/0114025 A1 | | 8/2002 | Raynor et al. | |
| 2005/0248675 A1 | * | 11/2005 | Hashimoto et al. | 348/308 |
| 2006/0208163 A1 | * | 9/2006 | Manabe et al. | 250/208.1 |
| 2006/0256221 A1 | | 11/2006 | McKee et al. | |

(Continued)

FOREIGN PATENT DOCUMENTS

| | | |
|---|---|---|
| CN | 1957599 | 5/2007 |
| JP | 2007 115994 | 5/2007 |

(Continued)

OTHER PUBLICATIONS

"Optimal Design of CMOS Pseudoactive Pixel Sensor (PAPS) Structure for Low-Dark Current and Large-Array-Size Imager Applications," Yu-Chuan Shih et al., Sensors Journal, IEEE, Oct. 2005, vol. 5, Issue 5, pp. 956-963.

(Continued)

*Primary Examiner* — Roberto Velez
*Assistant Examiner* — Stephen Coleman
(74) *Attorney, Agent, or Firm* — Perkins Coie LLP

(57) ABSTRACT

A method and apparatus for reducing space and pixel circuit complexity by using a 4-way shared vertically aligned pixels in a same column. The at least four pixels in the pixel circuit share a reset transistor and a source follower transistor, can have a plurality of same colored pixels and a plurality of colors, but do not include a row select transistor.

17 Claims, 10 Drawing Sheets

(56) References Cited

U.S. PATENT DOCUMENTS

| | | |
|---|---|---|
| 2006/0284177 A1 | 12/2006 | Hynecek |
| 2007/0023801 A1 | 2/2007 | Hynecek |
| 2007/0040922 A1 | 2/2007 | McKee et al. |
| 2007/0046746 A1* | 3/2007 | Park ............................... 347/88 |
| 2007/0046796 A1 | 3/2007 | McKee |
| 2007/0164332 A1 | 7/2007 | Paik et al. |
| 2007/0164335 A1 | 7/2007 | McKee |
| 2007/0267666 A1 | 11/2007 | Park et al. |
| 2007/0273779 A1 | 11/2007 | Abe et al. |
| 2008/0246865 A1 | 10/2008 | Hashimoto |
| 2008/0291310 A1* | 11/2008 | Ladd et al. .................... 348/308 |
| 2008/0309810 A1* | 12/2008 | Smith et al. .................... 348/319 |
| 2009/0190015 A1* | 7/2009 | Bechtel et al. ................. 348/302 |
| 2009/0237541 A1* | 9/2009 | Johnson et al. ............... 348/308 |

FOREIGN PATENT DOCUMENTS

| | | |
|---|---|---|
| JP | 2007 123679 | 5/2007 |
| JP | 2007 124046 | 5/2007 |
| KR | 10-2008-0013495 A | 2/2008 |
| WO | WO 2007 108129 | 9/2007 |
| WO | WO 2008/018721 A1 | 2/2008 |

OTHER PUBLICATIONS

"A 2.0-/spl mu/m Pixel Pitch MOS Image Sensor with 1.5 Transistor/Pixel and an Amorphous Si Color Filter," Kasano et al., Electronic Devices, IEEE Transactions, Apr. 2006, vol. 53, Issue 4, pp. 611-617.

"A 3.9-/spl mu/m Pixel Pitch VGA Format 10-b Digital Output CMOS Image Sensor with 1.5 Transistor/Pixel," Takahashi et al., Solid-State Circuits, IEEE Journal of, Dec. 2004, vol. 39, Issue 12, pp. 2417-2425.

"The Features and Characteristics of 5M CMOS Image Sensor with 1.9/spl times/1.9/spl mu/m/sup 2/pixels," Electron Devices Meeting, 2005, Dec. 2005, pp. 4.

"A Computational Digital-Pixel-Sensor VLSI Featuring Block-Readout Architecture for Pixel-Parallel Rank-Order Filtering," Circuits and Systems, May 2005, vol. 3, pp. 2389-2392.

\* cited by examiner

US 9,210,347 B2

VERTICAL 4-WAY SHARED PIXEL IN A SINGLE COLUMN WITH INTERNAL RESET AND NO ROW SELECT

CROSS-REFERENCE TO RELATED APPLICATIONS

This application is a divisional of application Ser. No. 12/285,308, filed Oct. 1, 2008, the entirety of which is incorporated herein by reference.

BACKGROUND OF THE INVENTION

1. Field of the Invention

Embodiments described herein relate generally to improved semiconductor imaging devices and in particular to imaging devices having an array of pixels and to methods of operating the pixels to reduce temporal noise.

2. Background of the Invention

A conventional four transistor (4T) circuit for a pixel 150 in a pixel array 230 of a CMOS imager is illustrated in FIG. 1. The 4T pixel 150 has a photosensor such as a photodiode 162, a reset transistor 184, a transfer transistor 190, a source follower transistor 186, and a row select transistor 188. It should be understood that FIG. 1 shows the circuitry for operation of a single pixel 150, and that in practical use, there will be an M×N array of pixels arranged in rows and columns with the pixels of the array 230 being accessed using row and column select circuitry, as described in more detail below.

The photodiode 162 converts incident photons to electrons, which are selectively passed to a floating diffusion region A through the transfer transistor 190 when activated by a TX1 control signal. The source follower transistor 186 has its gate connected to floating diffusion region A and thus amplifies the signal appearing at the floating diffusion region A. When a particular row containing pixel 150 is selected by an activated row select transistor 188, the signal amplified by the source follower transistor 186 is passed on a column line 170 to column readout circuitry (242, FIGS. 2-4). The photodiode 162 accumulates a photo-generated charge in a doped region of its substrate during a charge integration period. It should be understood that the pixel 150 may include a photogate or other photon to charge converting device, in lieu of a photodiode, as the initial accumulator for photo-generated charge.

The gate of transfer transistor 190 is coupled to a transfer control signal line 191 for receiving the TX1 control signal, thereby serving to control the coupling of the photodiode 162 to region A. A voltage source Vpix is selectively coupled through reset transistor 184 and conductive line 163 to floating diffusion region A. The gate of the reset transistor 184 is coupled to a reset control line 183 for receiving a RST control signal to control the reset operation in which the voltage source Vpix is connected to floating diffusion region A.

A row select signal (Row Sel) on a row select control line 160 is used to activate the row select transistor 188. Although not shown, the row select control line 160, reset control line 183, and transfer signal control line 191 are coupled to all of the pixels of the same row of the array. The voltage source Vpix is coupled to transistors 184 and 186 by conductive line 195. The column line 170 is coupled to the output of all of the pixels of the same column of the array and typically has a current sink 176 at one end. Signals from the pixel 150 are selectively coupled to a column readout circuit 242 (FIGS. 2-4) through the column line 170.

As is known in the art, a value can be read from pixel 150 in a two step correlated double sampling process. First, floating diffusion region A is reset by activating the reset transistor 184. The reset signal (e.g., Vrst) found at floating diffusion region A is readout to column line 170 via the source follower transistor 186 and the activated row select transistor 188. During a charge integration period, photodiode 162 produces charge from incident light. This is also known as the image intergration period. After the integration period, the transfer transistor 190 is activated and the charge from the photodiode 162 is passed through the transfer transistor 190 to floating diffusion region A, where the charge is amplified by the source follower transistor 186 and passed to the column line 170 (through the row select transistor 188) as an integrated charge signal Vsig. In some instances, the reset signal Vrst is provided after the integrated charge signal Vsig. As a result, two different voltage signals—the reset signal Vrst and the integrated charge signal Vsig—are readout from the pixel 150 onto the column line 170 and to column readout circuitry 242, where each signal is sampled and held for further processing as is known in the art. Typically, all pixels in a row are readout simultaneously onto respective column lines 170 and the column lines may be activated in sequence or in parallel for pixel reset and signal voltage readout.

FIG. 2 shows an example CMOS imager device 201 that includes the pixel array 230 and a timing and control circuit 232, which provides timing and control signals to enable reading out of signals stored in the pixels in a manner commonly known to those skilled in the art. Example arrays have dimensions of M×N pixels, with the size of the array 230 depending on a particular application. In the illustrated imager device 201, the pixel signals from the array 230 are readout a row at a time using a column parallel readout architecture. The controller 232 selects a particular row of pixels in the array 230 by controlling the operation of row addressing circuit 234 and row drivers 240. Reset Vrst and image Vsig signals in the selected row of pixels are provided on the column lines 170 to a column readout circuit 242 in the manner described above. The signals read from each of the columns can be readout sequentially or in parallel using a column addressing circuit 244. Pixel signals (Vrst, Vsig) corresponding to the readout reset signal and integrated charge signal are provided as respective outputs Vout1, Vout2 of the column readout circuit 242 where they are subtracted in differential amplifier 246, digitized by analog-to-digital converter (ADC) 248, and sent to an image processor circuit 250 for image processing.

FIG. 3 shows more details of one example of the arrangement of the rows and columns 249 of pixels 150 in the array 230. Each column 249 includes multiple rows of pixels 150. Signals from the pixels 150 in a particular column 249 can be readout to sample and hold circuitry 261 associated with the column 249 (part of circuit 242) for acquiring the pixel reset Vrst and integrated charge Vsig signals. Signals stored in the sample and hold circuits 261 can be read sequentially column-by-column to the differential amplifier 246 (FIG. 2), which subtracts the reset and integrated charge signals and sends them to the analog-to-digital converter 248 (FIG. 2). Alternatively, a plurality of analog-to-digital converters 248 may also be provided, each digitizing sampled and held signals from one or more columns 249.

FIG. 4 illustrates portions of three sample and hold circuits 261 of FIG. 3 in greater detail. Each sample and hold circuit 261 holds a set of signals, e.g., a reset signal Vrst and an integrated charge signal Vsig from a desired pixel. For example, a reset signal Vrst of a desired pixel connected to column line 170 is stored on capacitor 226 and the integrated charge signal Vsig from column line 170 is stored on capacitor 228. A front side of capacitor 226 is switchably coupled to the column line 170 through switch 222 and a backside of capacitor 226 is switchably coupled to amplifier 248 through switch 218. A front side of capacitor 228 is switchably coupled to the column line 170 through switch 220 and a backside of capacitor 228 is switchably coupled to amplifier 248 through switch 216. The front side of capacitor 226 is switchably coupled to the front side of capacitor 228 through crowbar switch 239. The backside of capacitor 226 is switchably coupled to the backside of capacitor 228 and to a reference voltage Vref source through clamp switch 299.

Each sample and hold circuit 261 is coupled to amplifier 248 having first and second inputs. The first input of amplifier 248 is coupled to a first output of amplifier 248 through a capacitor 278 and a switch 279 to provide a first feedback circuit. The second input of amplifier 248 is coupled to a second output of amplifier 248 through a capacitor 276 and a switch 277 to provide a second feedback circuit.

The CMOS imager of FIGS. 1-4 has identical correlated double sampling and holding timing for all columns over an entire row. Thus, all of the pixels in a row are readout at substantially the same time. The simplified correlated double sampling and column read out timing is depicted in FIG. 5.

Thus, to begin a readout operation, a logic high clamp signal cl is provided to clamp switch 299 thereby coupling the backsides of capacitors 226, 228 to a reference voltage source Vref. When a reset signal Vrst is read from the pixel 150, a logic high SHR signal is provided to the gate of switch 222 thereby coupling the front side of capacitor 226 to the column line 170. When the readout of the reset signal Vrst from the pixel 150 is complete, a logic low SHR signal is provided to the gate of switch 222 thereby uncoupling the front side of capacitor 226 from the column line 170. Thus, a reset signal Vrst has been sampled and stored on capacitor 226.

After the reset Vrst signal is read from pixel 150, an integrated charge signal Vsig is readout. When the integrated charge signal Vsig is read from pixel 150, a logic high SHS signal is provided to the gate of switch 220 thereby coupling the front side of capacitor 228 to the column line 170. When the readout of the integrated charge signal Vsig from the pixel 150 is complete, a logic low SHS signal is provided to the gate of switch 220 thereby uncoupling the front side of capacitor 228 from the column line 170. Thus, an integrated charge signal Vsig has been sampled and stored on capacitor 228.

When the readout operation is complete, a logic low clamp signal cl is provided to clamp switch 299 thereby uncoupling the backsides of capacitors 226, 228 from the reference voltage source Vref.

After a row of pixels has been readout, sampled, and held, then, generally in column order, the sample and hold circuits 261 output their stored signals to the amplifier 248. When reading from a first sample and hold circuit 261, a logic high control signal Φamp is provided to the feedback circuits to close switch 279 to couple the first output of amplifier 248 through capacitor 278 to its first input and to close switch 277 to couple the second output of amplifier 248 through capacitor 276 to its second input. A logic high crowbar control signal, e.g., crowbar1 for the sample and hold circuit 261 associated with the first column, is also provided to the sample and hold circuit 261 being readout to close the associated crowbar switch 239, thereby coupling the front side of capacitor 226 to the front side of capacitor 228. A logic high control signal, e.g., c1 for the sample and hold circuit 261 associated with the first column, is also provided to the sample and hold circuit 261 being readout to close switch 218 and switch 216, thereby coupling the backside of capacitor 226 to the first input of amplifier 248 and coupling the backside of capacitor 228 to the second input of amplifier 248.

After the reset and integrated charge signals have been readout to amplifier 248, a logic low control signal Φamp is provided to the feedback circuits to open switch 279 and uncouple the first output of amplifier 248 from capacitor 278 and to open switch 277 and uncouple the second output of amplifier 248 from capacitor 276. A logic low crowbar control signal (e.g., crowbar 1 for the first column) is provided to the sample and hold 261 being readout to open the associated crowbar switch 239, thereby uncoupling the front side of capacitor 226 from the front side of capacitor 228. A logic low control signal e.g., c1, is also provided to the sample and hold 261 being readout to open switch 218 and switch 216, thereby uncoupling the backside of capacitor 226 from the first input of amplifier 248 and uncoupling the backside of capacitor 228 from the second input of amplifier 248. Thus, a correlated double sampled signal is provided as output from amplifier 248 resulting from the input of the integrated charge and reset signals to the amplifier 248. After a row of sample and hold circuits 261 have been readout, a next of row of pixels 150 in the pixel array 230 are sample, held, and then readout through the amplifier 248.

FIG. 6 illustrates a modified pixel array 230' that uses 4-way shared pixel circuitry comprising four pixels in neighboring columns and which desirably omits a row select transistor in the readout circuit for the shared pixel circuits. The pixel array 230' is an alternative to the pixel array 230. The pixel array 230' is comprised of even columns that include pixels 450a-d and odd columns that include pixels 451a-d. Although pixel array 230' is depicted as including three columns and four rows, the pixel array 230' is representative of a pixel array having any plurality of rows and columns. The columns of the pixel array 230' are labeled Y(m+1), Y(m), and Y−1(m+1) and the rows of pixel array 230' are labeled X(n), X(n+1), X(n+2), and X(n+3).

In array 230' pixels are diagonally grouped by color into a pixel circuit; thus, green pixels are grouped together and blue and red pixels are grouped together. A green pixel circuit, for example PixelCircuit1, is comprised of pixels 451a, 450b, 451c, and 450d. The green pixel circuit PixelCircuit1 also includes a reset transistor 484 and a source follower transistor 486. A blue and red pixel circuit, for example PixelCircuit2, is comprised of pixels 450a, 451b, 450c, and 451d. The blue and red pixel circuit PixelCircuit2 also includes a reset transistor 485 and a source follower transistor 487. In operation, the green pixel circuit PixelCircuit1 is readout, row by row, through a single column line, e.g., Col Y(m+1) and the blue and red pixel circuit PixelCircuit2 is readout, row by row, through a single column line, e.g., Col Y(m). No row select transistors are used in the readout circuit to couple the source follower transistors 486, 487 to a column line.

Pixel array 230' also includes transfer transistor control lines associated with each row of the array 230', e.g., TX X(n) for pixels in row X(n) associated with transfer transistors 490a and 491a. Additionally, pixel array 230' includes reset transistor control lines associated with each group of four rows of the array, e.g., RST X(n) for pixels in rows X(n), X(n+1), X(n+2), and X(n+3), associated with reset transistors 484, 485. Moreover, pixel array 230' includes column pull up (Col_Pu) transistors 498 to control coupling a Vaa-pix voltage to a column line 496, 497.

FIG. 7 depicts a simplified correlated double sampling and column read out timing for the pixel array 230' of FIG. 6. To begin a readout operation of a row X(n), at a time t1, a row address X(n) is provided to row addressing circuit 234 and column addressing circuit 244 of FIG. 2. A Col_Pu signal is applied to transistors 498 to couple lines 496, 497 to a voltage (e.g., Vaa-pix signal level) and therefore to activate the reset transistors 484, 485. At time t2, a logic high RST signal is provided to the reset line RST X(n), thereby placing a reset charge on one of a source or drain of reset transistors 484, 485. The floating diffusion regions 494, 495 are reset by this operation. At time t3, a logic low Col_Pu signal is applied to transistors 498 to turn off transistors 498 and to deactivate reset transistors 484, 485, no longer resetting diffusion regions 494, 495. Time t3 occurs approximately 250-750 ns after time t2 occurs, preferably 500 ns.

At time t4, a logic high VLN_EN control signal is provided to the gates of column line transistors 491, 492, thereby creating a pull down circuit on the associated column lines, e.g., 496, 497. Time t4 occurs 50-100 ns after time t3, preferably 70 ns. After time t4, a logic high SHR signal is strobed to sample and hold a reset signal Vrst readout of the floating diffusion regions 494, 495 into sample and hold circuitry. The SHR strobe lasts approximately 1-2 μs, preferably 1.5 μs. A logic high TX(n) then is strobed, which closes transfer transistors 491a, 490a and couples the photodiodes 462 to their associated floating diffusion regions 494, 495, thereby transferring the accumulated charge from the photodiode 462 to their associated floating diffusion regions 494, 495. The TX strobe lasts approximately 500-1000 ns, preferably 750 ns, ending at time t5. A logic high SHS signal is strobed to sample and hold accumulated charge read from the floating diffusion regions 494, 495 into sample and hold circuitry. The SHS signal begins to be strobed before the TX strobe has completed, e.g., before time t5. The strobe of the SHS signal lasts approximately 1-2 μs, preferably 1.5 μs and ends at time t6. At time t7, a logic low VLN_EN signal is provided thereby no longer creating a pulldown circuit on the associated column line. Time t7 occurs approximately 50-100 ns, preferably, 70 ns, after time t6, e.g., the completion of the SHS strobe. Subsequently, a logic high Col_Pu signal and a logic low RST(n) signal are provided. Thus, a reset signal and a charge accumulation signal are sampled from the pixel array 230'.

At t8, a rolling shutter operation occurs. A row address X(n+m) is provided to row addressing circuit 234 and column addressing circuit 244 of FIG. 2, which is used for a rolling shutter. After time t8, a logic high RST(n+m) signal and a logic high TX(n+m) are provided. The strobe of the TX(n+m) signal occurs while the RST(n+m) is provided with a logic high signal. After the rolling shutter operation ends, e.g., at time t9, the next row of the pixel array is sampled, e.g., row n+1. The pixel array continues to be readout, row by row, until substantially all of the rows of the pixel array have been readout. Thus, a reset signal and a charge accumulated signal are read out from the pixel array. Further, a rolling shutter has been toggled.

With the pixel array 230' (FIG. 6) PixelCircuit1, PixelCircuit2, are comprised of zigzagged pixels in two neighboring columns, so the pixel circuits are asymmetric and are difficult to significantly reduce in size.

It is desirable to have a shared pixel circuit that is more compact and of reduced size.

DETAILED DESCRIPTION OF THE INVENTION

In the following detailed description, reference is made to the accompanying drawings, which form a part hereof, and in which is shown by way of illustration specific embodiments that may be practiced. These embodiments are described in sufficient detail to enable those of ordinary skill in the art to make and use them, and it is to be understood that structural, logical, or procedural changes may be made.

Figure 6:
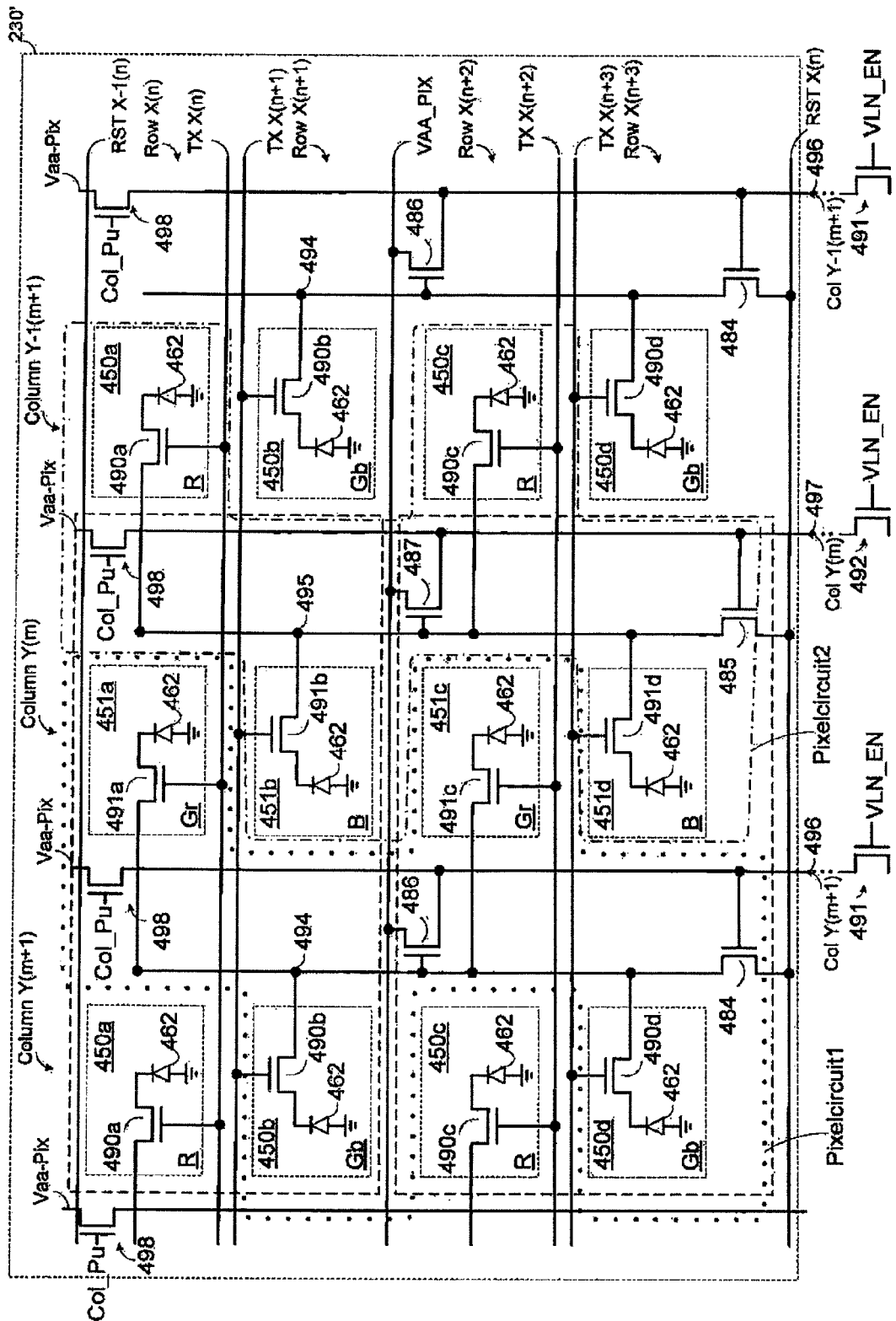
FIG. 6 is a block diagram of a diagonally shared pixel circuit.
Figure 7:
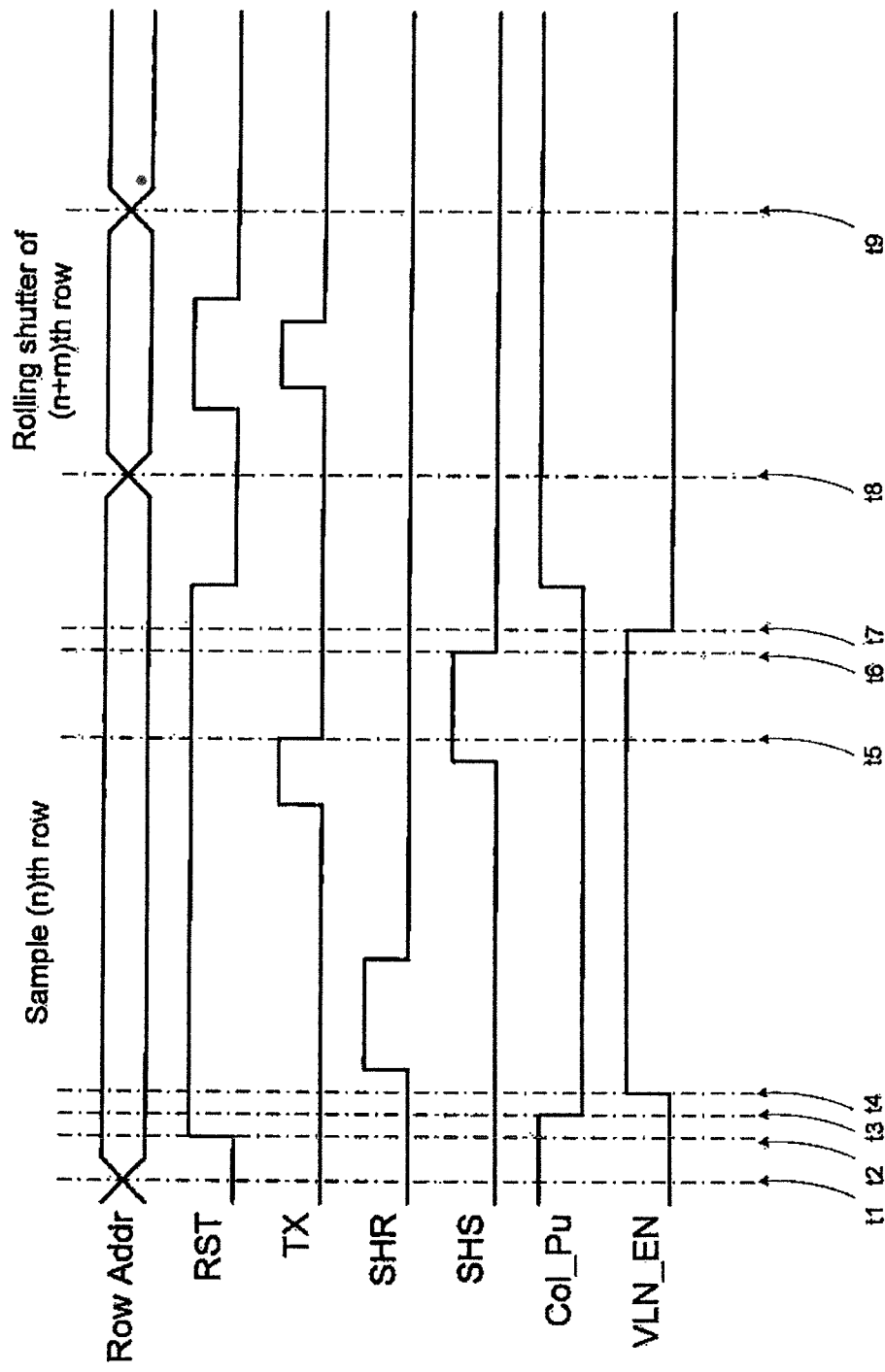
FIG. 7 is a simplified timing diagram associated with operation of the circuitry of FIG. 6.

Embodiments described herein provide a shared pixel circuit which omits a row select transistor in the readout circuit of a shared pixel and which reduces the size and complexity required by the shared pixel array depicted in FIG. 6. By providing a vertically shared (i.e., within the same column) pixel circuit, the overall size of the pixel array can be reduced. With a pixel circuit being shared vertically instead of across columns, associated readout circuitry is less complex. Thus, pixel circuits are symmetrical and can be reduced in size. Furthermore, the pixel circuits can also be readout quicker than the pixel circuit of FIG. 6.

Figure 8:
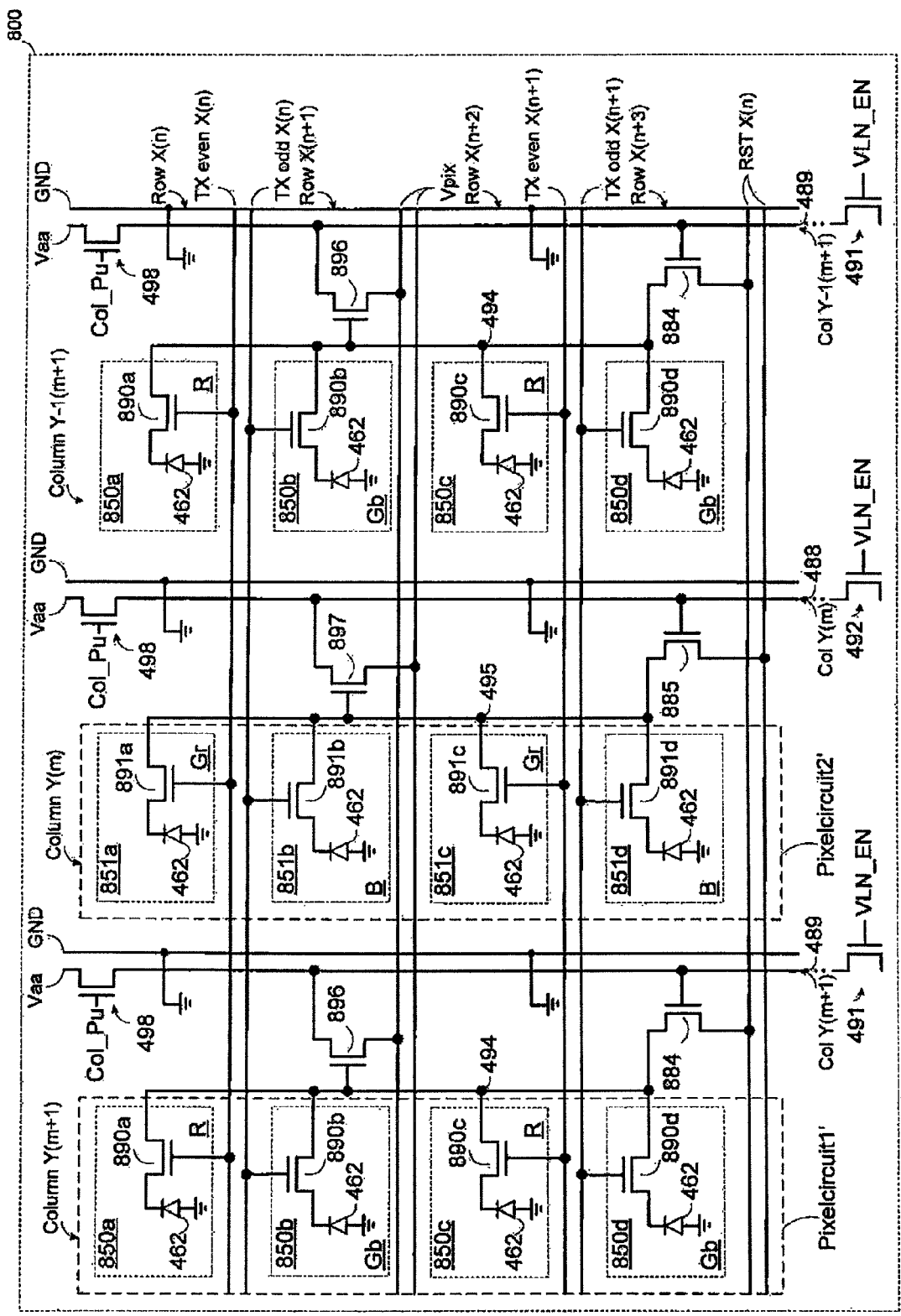
FIG. 8 is a block diagram of a vertically shared pixel circuit in accordance with an example embodiment disclosed herein.

FIG. 8 illustrates a pixel array 800 comprising vertically 4-way shared pixel circuitry, each comprising four pixels in a same column in accordance with an example embodiment. The pixel array 800 is comprised of even columns that include pixels 850a-d and odd columns that include pixels 851a-d. Although pixel array 800 is depicted as including three columns and four rows, the pixel array 800 is representative of a pixel array having any plurality of rows and columns. The columns of the pixel array 800 are labeled Y(m+1), Y(m), and Y−1(m+1) and the rows of pixel array 800 are labeled X(n), X(n+1), X(n+2), and X(n+3).

In illustrated embodiment, pixels are vertically grouped by column into a shared pixel circuit; thus, four pixels in a column are grouped together. A first shared pixel circuit, for example PixelCircuit1', is comprised of pixels 850a, 850b, 850c, and 850d. The first pixel circuit PixelCircuit1' also includes a reset transistor 884 and a source follower transistor 896. PixelCircuit1' does not include a row select transistor. A second shared pixel circuit, for example PixelCircuit2', is comprised of pixels 851a, 851b, 851c, and 851d. The second pixel circuit PixelCircuit2' also includes a reset transistor 885 and a source follower transistor 897 and does not include a row select transistor.

Each shared pixel circuit, e.g., PixelCircuit1' has a plurality of pixels, and at least two of the plurality of pixels are of a same color. For example, as depicted in FIG. 8, PixelCircuit1' includes two green pixels 850b, 850d. Additionally, PixelCircuit1' includes two pixels of a second same color, e.g., pixels 850a, 850c are red. Similarly, PixelCircuit2' includes two green pixels 851a, 851c and two blue pixels 851b, 851d. All of the plurality of pixels of the shared pixel circuit are in a same column of pixels. For example, the pixels of PixelCircuit1' are all in column Y(m+1). Each column of pixels in array 230' includes a plurality of pixel circuits.

In an aspect, the pixel array 800 includes a plurality of ground (GND) lines that run in a vertical direction of the array. These ground lines are connected throughout the array 800 at various locations to a ground source. Including a plurality of GND lines that are relatively locally connected to a ground source reduces noise. Pixel array 800 includes column pull up (Col_Pu) transistors 498 to control coupling a Vaa-pix voltage to a column line 488, 489.

Figure 1:
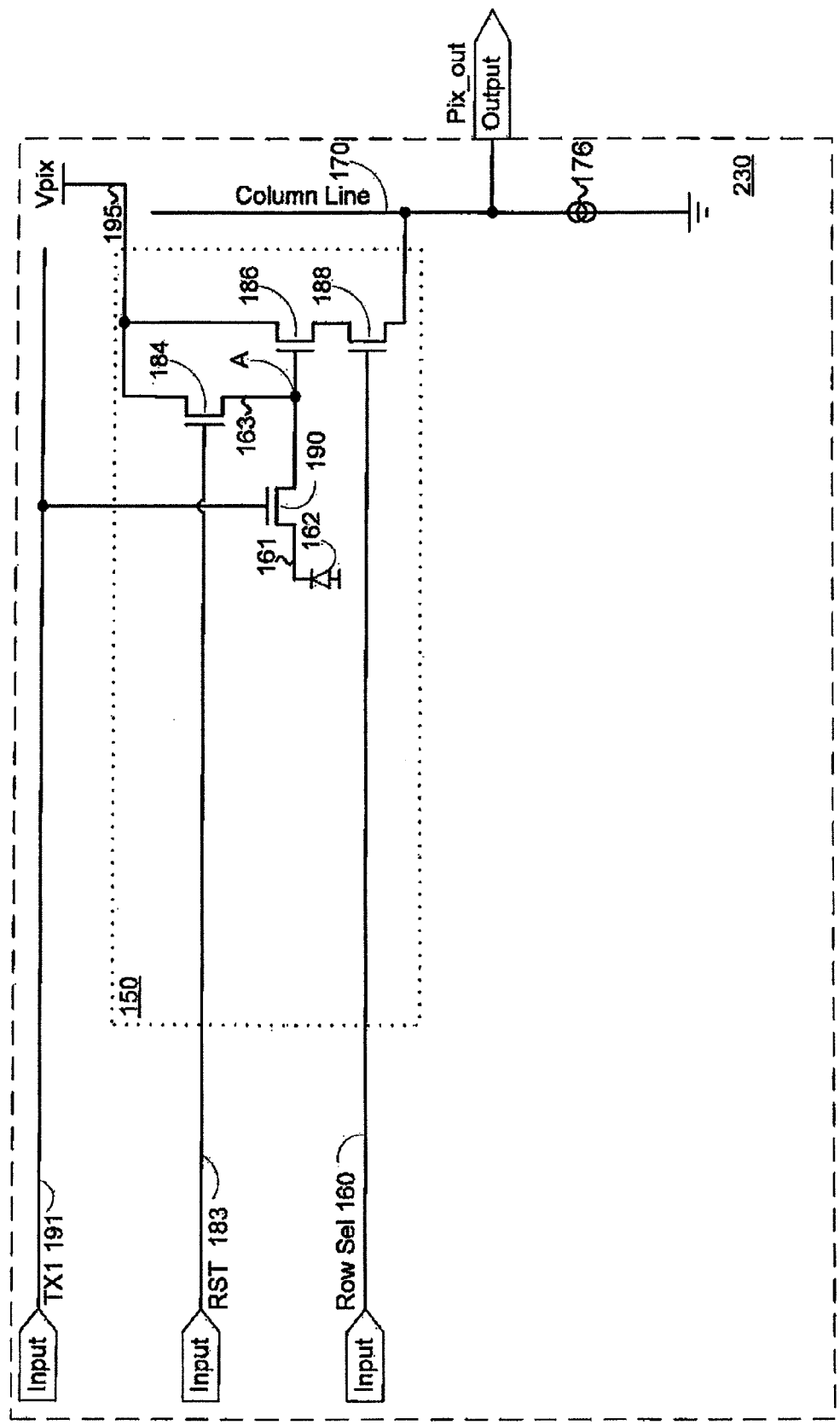
FIG. 1 is a schematic diagram of a conventional imager pixel.
Figure 2:
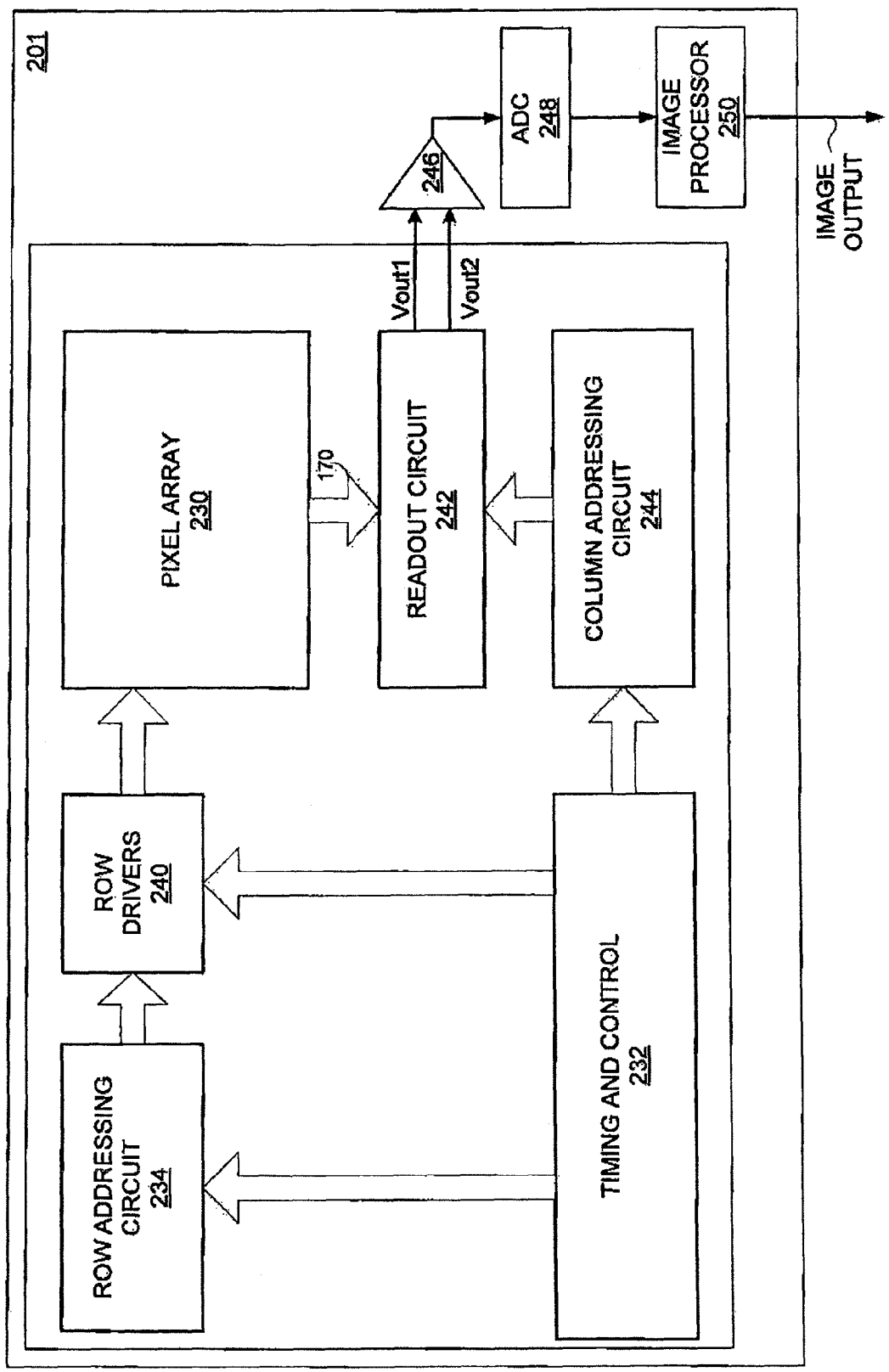
FIG. 2 is a block diagram of a conventional imager device.
Figure 3:
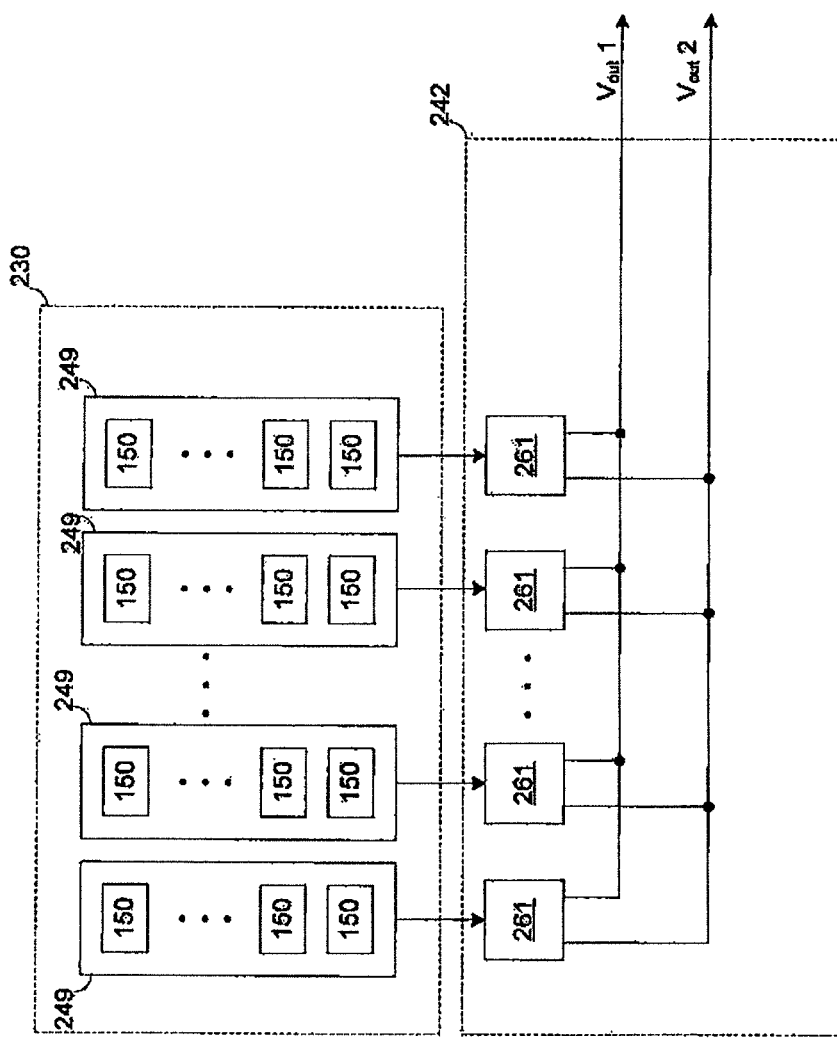
FIG. 3 is a block diagram of a portion of an array of pixels illustrated in FIG. 2 and an associated column readout circuit.
Figure 4:
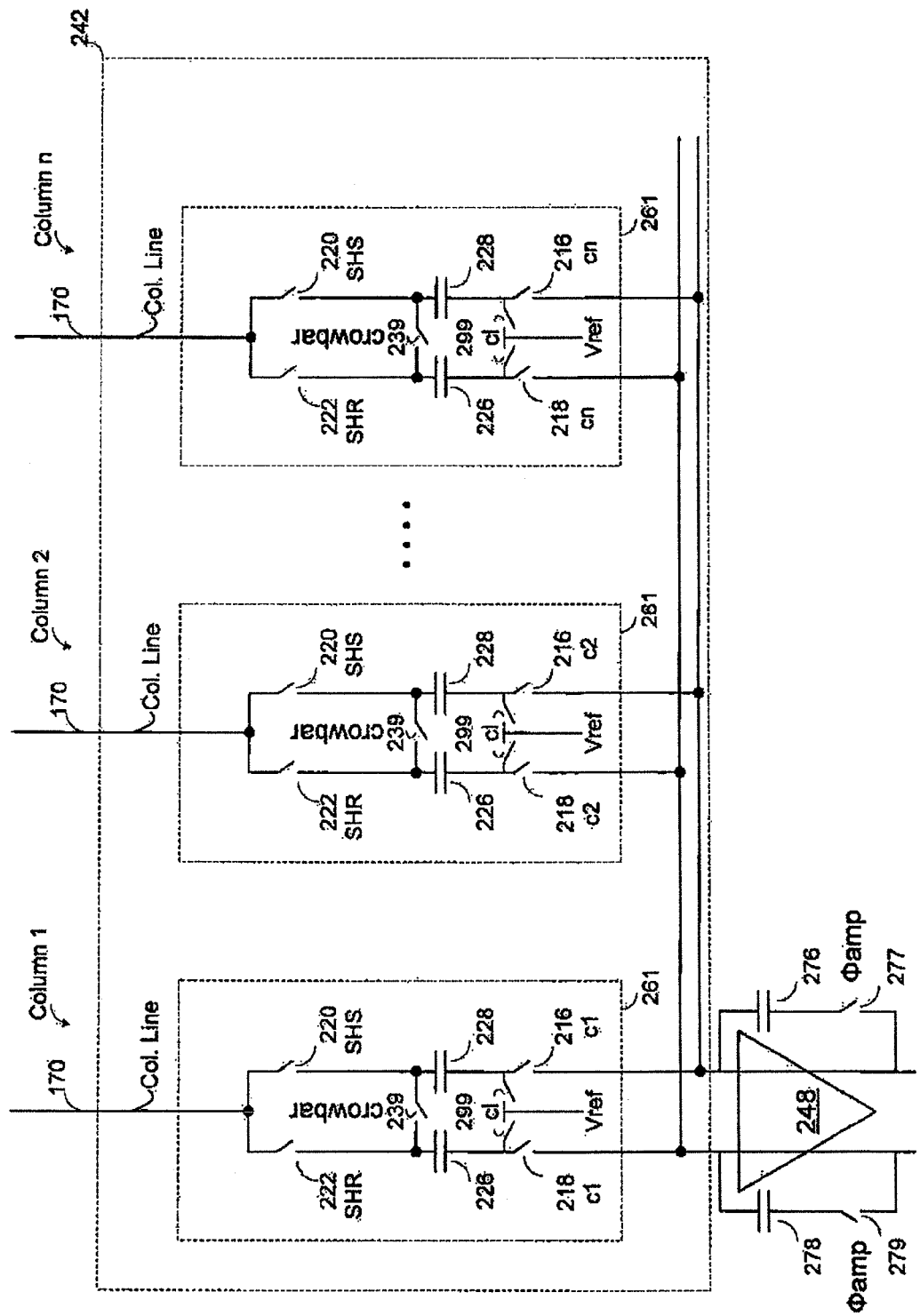
FIG. 4 is a conventional sample and hold circuit.
Figure 5:
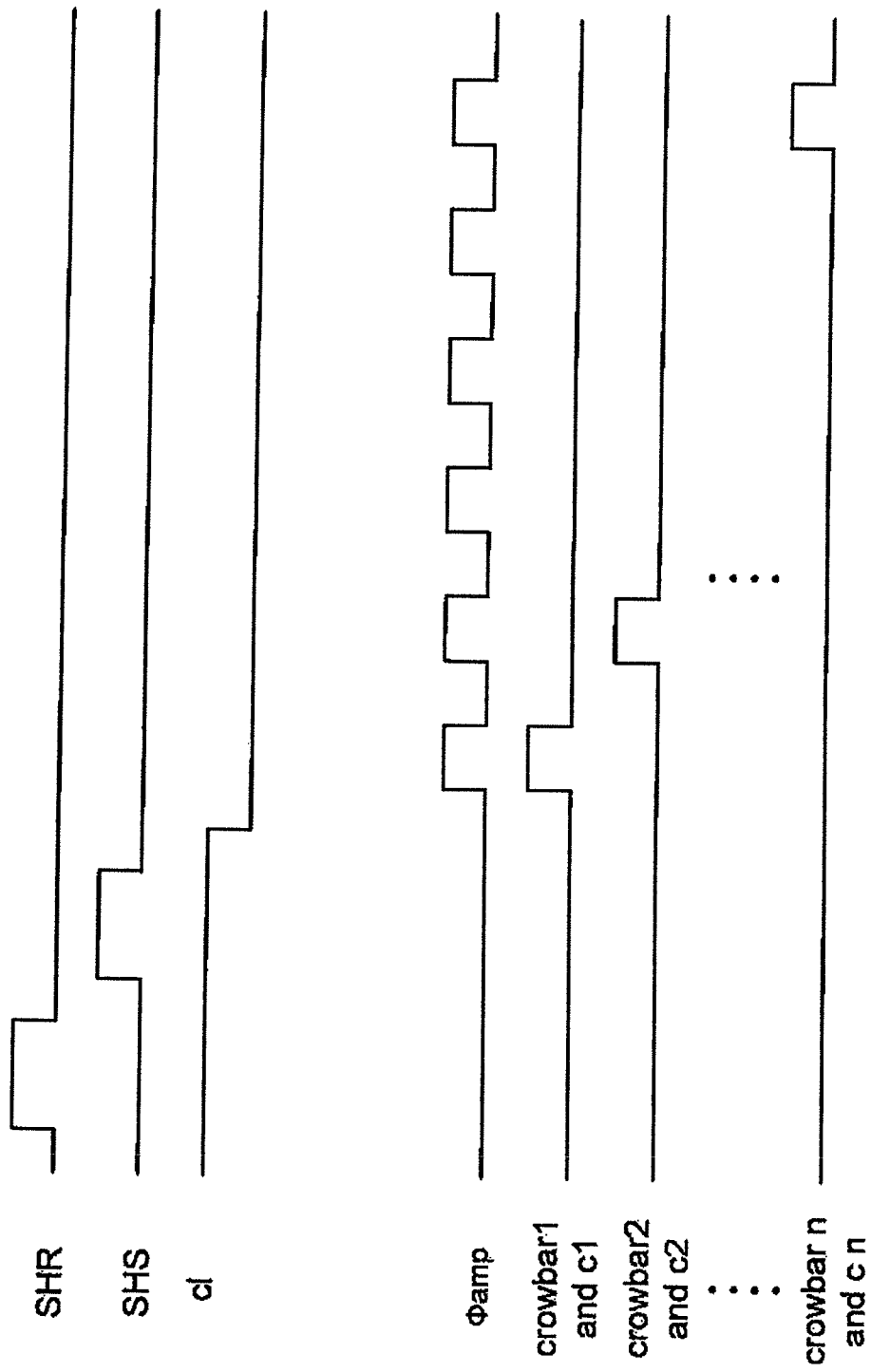
FIG. 5 is a simplified timing diagram associated with operation of the circuitry of FIGS. 1-4.
Figure 9:
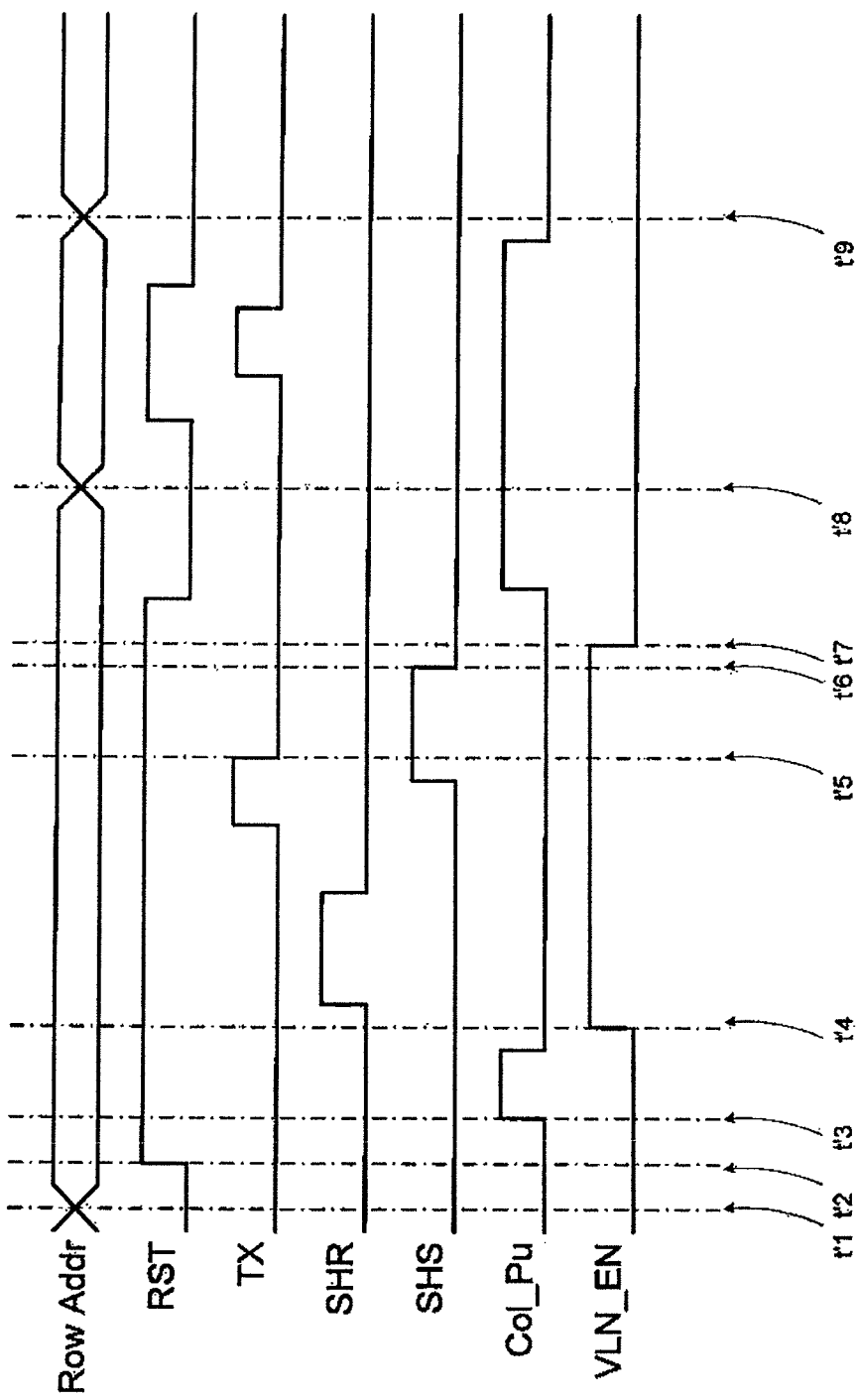
FIG. 9 is simplified timing diagram associated with operation of the circuitry of FIG. 8.

FIG. 9 depicts a simplified correlated double sampling and column read out timing for the pixel array 800 of FIG. 8. To begin a readout operation of a row X(n), at a time t'1, a row address X(n) is provided to row addressing circuit 234 and column addressing circuit 244 FIG. 2. At time t'2, a logic high RST signal is provided to the reset line RST X(n), thereby placing a charge on one of a source or drain of reset transistors 884, 885. The floating diffusion regions 494, 495 are reset. At time t'3, a logic high Col_PU signal is provided to transistors 498 thereby coupling the lines 488, 489 to a voltage, e.g., Vaa_pix voltage level and enabling diffusion regions 494, 495 to be reset (via the reset transistors 884, 885). In an aspect, time t'3 occurs approximately 250-750 ns after time t'2 occurs, preferably 500 ns. Before time t'4 occurs, a logic low Col_Pu signal is provided to transistors 498 thereby uncoupling the lines 488, 489 from the voltage, e.g., Vaa_pix voltage level, and disabling diffusion regions 494, 495 from being further reset.

At time t'4, a logic high VLN_EN control signal is provided to the gates of transistors 491, 492 thereby creating a pull down circuit on the associated column lines, e.g., 488, 489. In one aspect, time t'4 occurs approximately 50-100 ns after time t3, preferably 70 ns. After time t'4, a logic high SHR signal is strobed to sample and hold a reset signal read from the floating diffusion regions 494, 495 into a sample and hold circuit. In an aspect, the SHR strobe lasts approximately 1-2 μs, preferably 1.5 μs. A logic high TX(n) is strobed which closes transfer transistors 891a, 890a and couples the photodiodes 462 to their associated floating diffusion regions 494, 495 transferring the accumulated charge from the photodiodes 462 to their associated floating diffusion regions 494, 495. In an aspect the TX(n) strobe lasts approximately 50-100 ns, preferably 70 ns, and ends at time t'5. A logic high SHS signal is strobed to sample and hold the accumulated charge read from the floating diffusion regions 494, 495 into a sample and hold circuit. In a preferred approach, the SHS signal begins to be strobed before time t'5, e.g., before the TX(n) strobe has completed. In an aspect, the strobe of the SHS signal lasts approximately 1-2 μs, preferably 1.5 μs, and ends at time t'6. At time t'7, a logic low VLN_EN is provided thereby no longer creating a pulldown circuit on the associated column line. In an aspect time t'7 occurs approximately 50-100 ns, preferably, 70 ns, after the completion of the SHS strobe. Subsequently, a logic low RST(n) signal is provided. Thus, a reset signal and a charge accumulation signal are sampled from the pixel array. After that, the Col_Pu is enabled with RST(n) at low to reset the floating diffusion regions 494, 495 to a low potential, which turns off the source follower transistor on the nth row.

At time t'8, a rolling shutter operation begins. A row address X(n+m) is provided to row addressing circuit 234 and column addressing circuit 244 (FIG. 2), which is used to implement a rolling shutter. After time t'8, the logic high RST(n+m) signal and a logic high TX(n+m) are provided to reset the floating diffusion regions 494, 495 and photodiodes 462 to a high potential and fully deplete the photodiodes 462. In an aspect, the strobe of the TX(n+m) signal occurs while the RST(n+m) is provided with a logic high signal; the Col_Pu is high and keeps the RST (n+m) at low to turn off the source follower on the (n+m)th row. After an initial aspect of the rolling shutter operation ends at time t'9, the next row of the pixel array is sampled, e.g., row n+1. As conventionally known, the pixel array continues to be readout, row by row, until substantially all of the rows of the pixel array have been readout.

Figure 10:
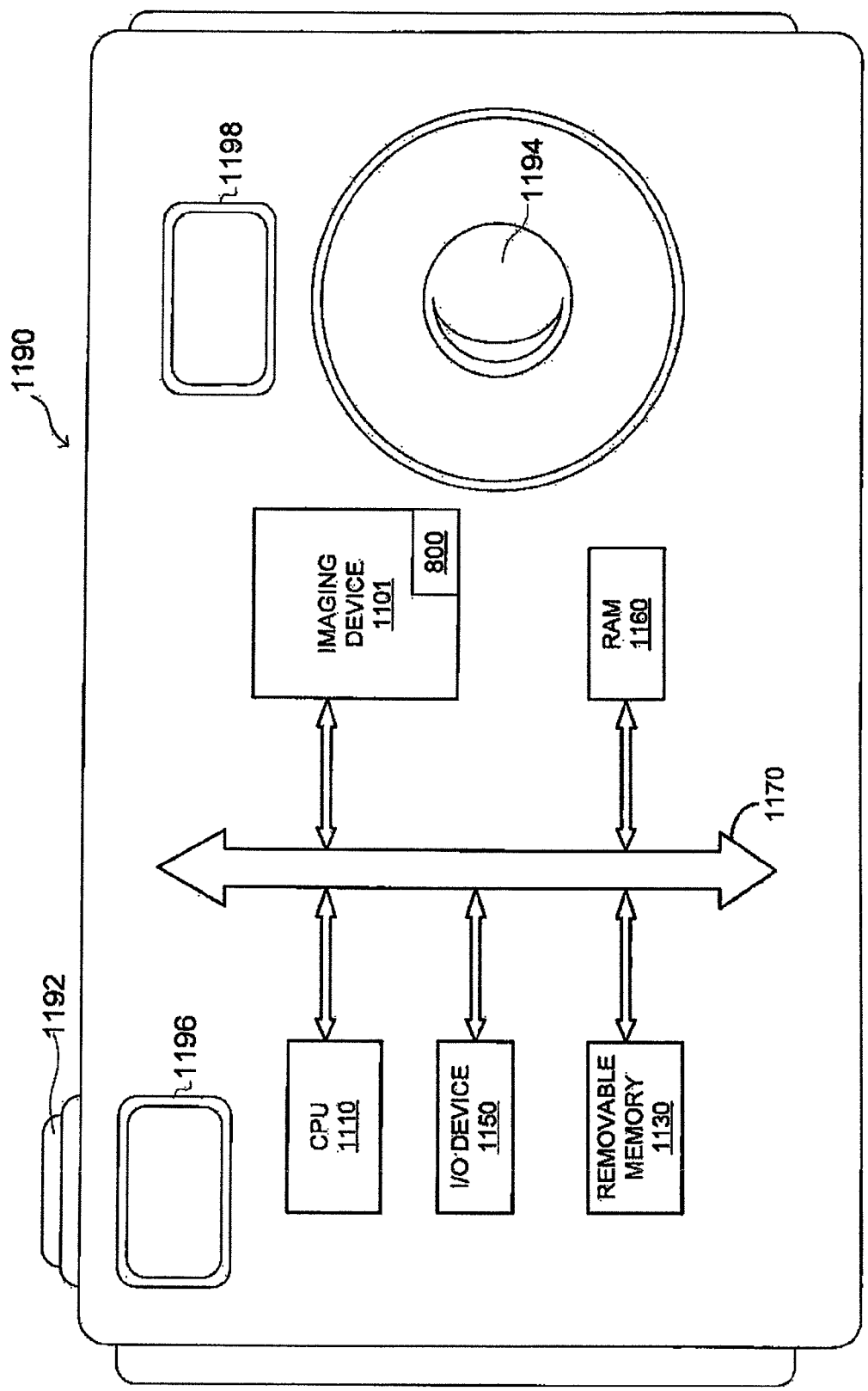
FIG. 10 is a block diagram representation of a processor-based camera system incorporating a CMOS imaging device in accordance with an embodiment disclosed herein.

FIG. 10 is a block diagram representation of processor system that may include imaging device 1101 having the pixel array 800 (FIG. 8) and associated readout circuitry as described with respect to the various embodiments described herein. The processor system could, for example, be a camera system 1190. A camera system 1190 generally comprises a shutter release button 1192, a view finder 1196, a flash 1198 and a lens system 1194 for focusing an image on the pixel array 800 of imaging device 1101. A camera system 1190 generally also comprises a central processing unit (CPU) 1110, for example, a microprocessor for controlling camera functions which communicates with one or more input/output devices (I/O) 1150 over a bus 1170. The CPU 1110 also exchanges data with random access memory (RAM) 1160 over bus 1170, typically through a memory controller. The camera system 1190 may also include peripheral devices such as a removable memory 1130, which also communicates with CPU 1110 over the bus 1170. Imager device 1101 is coupled to the processor system and includes a pixel array 800 as described along with respect to FIGS. 8-9. Other processor systems which may employ imaging devices 800 besides cameras, including computers, PDAs, cellular telephones, scanners, machine vision systems, and other systems requiring an imager operation.

While the embodiments have been described and illustrated with reference to specific example embodiments, it should be understood that many modifications and substitutions can be made. Although the embodiments discussed above describe specific numbers of transistors, photodiodes, conductive lines, etc., they are not so limited. For example, the above embodiments are not limited to vertical (single column) with internal reset and no row select of a 4 way shared pixel and could be applied to 2 way shared, 3 way shared, 5 way shared, etc. Accordingly, the claimed invention is not to be considered as limited by the foregoing description but is only limited by the scope of the claims.

What is claimed as new and desired to be protected by Letters Patent of the United States is:

1. A method of reading from a pixel circuit comprising a plurality of 4-way shared pixels in a column of a pixel array, said method comprising:

applying a first logic signal on a column line to turn on a reset transistor, the reset transistor, when turned on, causing a reset voltage to be applied on a shared storage region to which each pixel of the 4-way shared pixels is commonly electrically coupled;

applying a second logic signal on the column line to turn off the reset transistor, wherein the first and second logic signals are complimentary to each other;

applying a third logic signal pulse to a transistor connected to the column line to enable readout of signals applied by a source follower transistor to a sample and hold circuit via the column line, wherein the source follower transistor is directly connected to the column line and has a gate connected to the shared storage region;

reading out a pixel reset signal onto the column line from the source follower transistor while the third logic signal pulse is applied to the transistor connected to the column line;

transferring a pixel image signal to the shared storage area; and reading out the pixel image signal onto the column line from the source follower transistor while the third logic signal pulse is applied to the transistor connected to the column line.

2. The method of claim 1, wherein the 4-way shared pixels are configured in respective sequential rows associated with the column line.

3. The method of claim 1, wherein the 4-way shared pixels in the column comprise a plurality of green pixels and a plurality of pixels of another color.

4. The method of claim 1, further comprising using a column pull up transistor to turn on and turn off the reset transistor connected to the column line.

5. The method of claim 1, wherein the first logic signal is a logic high signal, and the second logic signal is a logic low signal.

6. The method of claim 1, wherein said step of reading out the pixel reset signal further comprises:
applying a fourth logic pulse on a sample and hold reset signal control line to sample a reset signal on the column line.

7. The method of claim 6, wherein said step of reading out the pixel reset signal further comprises:
applying a fifth logic pulse on the sample and hold reset signal control line after the step of applying the fourth logic pulse.

8. The method of claim 6, wherein the fourth logic pulse is a logic high pulse.

9. The method of claim 6, wherein said step of reading out the pixel image signal further comprises:
applying a fifth logic pulse on a sample and hold image signal control line after applying the fourth logic pulse.

10. The method of claim 9, wherein the fifth logic pulse is a logic high pulse.

11. A method of reading from a pixel circuit comprising a plurality of at least four pixels in a column of a pixel array, each pixel including a photosensor and each pixel being commonly electrically coupled to a shared storage region, said method comprising:
turning on a reset transistor common to all of the plurality of at least four pixels by applying a first logic signal on a column line to which the gate of the reset transistor is coupled, causing a reset voltage to be applied on the shared storage region;
turning off the reset transistor by applying a second logic signal on the column line, wherein the first and second logic signals are complimentary to each other;
enabling the column line for readout by turning on a transistor connected to the column line to enable readout of signals applied by a source follower transistor to a sample and hold circuit via the column line, wherein the source follower transistor is directly connected to the column line and having has a gate connected to the shared storage region;
reading out the reset voltage from the pixel circuit through the source follower transistor;
transferring a pixel image signal from a photosensor of the pixel circuit to the shared storage region; and
reading out a pixel image signal onto the column line from the source follower transistor.

12. The method of claim 11, wherein each pixel of the plurality of pixels is configured in respective sequential rows of the first column.

13. The method of claim 11, wherein the plurality of pixels in the first column comprise a plurality of green pixels and a plurality of pixels of another color.

14. The method of claim 11, further comprising using a column pull up transistor on the column line to turn on and turn off the reset transistor connected to the column line.

15. The method of claim 11, further comprising using a sample and hold circuitry to sample and hold the reset voltage from the pixel circuit.

16. The method of claim 15, further comprising, after the reset voltage is read from the pixel circuit, transferring accumulated charge from a photosensor to the shared storage region.

17. The method of claim 16, further comprising using a sample and hold circuitry to sample and hold the accumulated charge from the photosensor.

* * * * *

UNITED STATES PATENT AND TRADEMARK OFFICE
CERTIFICATE OF CORRECTION

PATENT NO. : 9,210,347 B2
APPLICATION NO. : 13/733676
DATED : December 8, 2015
INVENTOR(S) : Zhiping Yin, Xiaofeng Fang and Xiangli Li It is certified that error appears in the above-identified patent and that said Letters Patent is hereby corrected as shown below:

Claims
In column 10, line 12, in claim 11, delete "having has a" and insert -- has a --, therefor.

Signed and Sealed this
Twenty-sixth Day of April, 2016

Michelle K. Lee
*Director of the United States Patent and Trademark Office*